United States Patent
Miwa et al.

(10) Patent No.: US 9,308,553 B2
(45) Date of Patent: Apr. 12, 2016

(54) METHOD FOR PRODUCING ORIENTATIONAL CERAMIC, ORIENTATIONAL CERAMIC, AND CERAMIC ELECTRONIC COMPONENT

(71) Applicant: MURATA MANUFACTURING CO., LTD., Nagaokakyo-Shi (JP)

(72) Inventors: Yasunari Miwa, Nagaokakyo (JP); Shinichiro Kawada, Nagaokakyo (JP); Masahiko Kimura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 579 days.

(21) Appl. No.: 13/897,730

(22) Filed: May 20, 2013

(65) Prior Publication Data

US 2014/0009037 A1 Jan. 9, 2014

(30) Foreign Application Priority Data

Jul. 5, 2012 (JP) ................. 2012-151175

(51) Int. Cl.
*H01L 41/22* (2013.01)
*H01L 41/187* (2006.01)
*C04B 33/00* (2006.01)
*B05D 5/12* (2006.01)
*C04B 35/493* (2006.01)
*C04B 35/626* (2006.01)
*C04B 35/634* (2006.01)
*H01L 41/273* (2013.01)

(52) U.S. Cl.
CPC ............. *B05D 5/12* (2013.01); *C04B 35/493* (2013.01); *C04B 35/6263* (2013.01); *C04B 35/63416* (2013.01); *C04B 35/63424* (2013.01); *H01L 41/187* (2013.01); *H01L 41/1876* (2013.01); *H01L 41/273* (2013.01); *C04B 2235/3251* (2013.01); *C04B 2235/3279* (2013.01); *C04B 2235/605* (2013.01); *C04B 2235/768* (2013.01); *C04B 2235/787* (2013.01)

(58) Field of Classification Search
CPC ......................................................... B05B 5/12
USPC ........................... 310/358; 252/69.2; 501/134
See application file for complete search history.

(56) References Cited

U.S. PATENT DOCUMENTS

| | | | |
|---|---|---|---|
| 8,632,723 B2 * | 1/2014 | Watanabe et al. ............. | 264/681 |
| 8,698,380 B2 * | 4/2014 | Watanabe et al. ............. | 310/358 |
| 8,702,885 B2 | 4/2014 | Matsuda et al. | |
| 2011/0298336 A1 * | 12/2011 | Saito et al. .................... | 310/358 |

FOREIGN PATENT DOCUMENTS

| | | |
|---|---|---|
| JP | S60-180955 A | 9/1985 |
| JP | 2002193672 A | 7/2002 |
| JP | 2004006704 A | 1/2004 |
| JP | 2008037064 A | 2/2008 |
| JP | 2010090021 A | 4/2010 |
| JP | 2011-184289 A | 9/2011 |
| JP | 2011-230373 A | 11/2011 |

* cited by examiner

OTHER PUBLICATIONS

Japanese Office Action issued for Japanese Patent Application No. 2012-151175, dated Apr. 22, 2014 (with English translation).

*Primary Examiner* — Thomas Dougherty
(74) *Attorney, Agent, or Firm* — Arent Fox LLP

(57) ABSTRACT

An additive that contains an emulsion binder resin substantially free of non-emulsion binder resin, such as an emulsion acrylic resin, is mixed into a ceramic raw material powder containing, as its main constituent, a perovskite-type compound to form a ceramic slurry. Then, an orientational ceramic is prepared by subjecting the slurry to a forming process while simultaneously or sequentially applying a magnetic field and drying the slurry. An orientational ceramic, even formed from a substance which has small magnetic anisotropy, such as PZT, is obtained.

20 Claims, 2 Drawing Sheets

METHOD FOR PRODUCING ORIENTATIONAL CERAMIC, ORIENTATIONAL CERAMIC, AND CERAMIC ELECTRONIC COMPONENT

BACKGROUND OF THE INVENTION

1. Field of the Invention

The present invention relates to a method for producing an orientational ceramic, an orientational ceramic, and a ceramic electronic component, and more particularly, relates to a method for producing an orientational ceramic which has a crystalline orientation, an orientational ceramic produced with the use of this production method, and a ceramic electronic component such as a piezoelectric ceramic electronic component and a dielectric ceramic electronic component using this orientational ceramic.

2. Description of the Related Art

Various electronic devices nowadays have ceramic electronic components mounted therein, and in these ceramic electronic components, ceramic sintered bodies which contain a ceramic material as their main constituent are widely used.

In addition, composite oxides which have a perovskite-type crystalline structure (hereinafter, referred to as "perovskite-type compounds") such as barium titanate and lead zirconate titanate (hereinafter, referred to as a "PZT") have been widely used as ceramic materials for use in dielectric bodies and piezoelectric bodies.

This type of ceramic sintered body is known to have various types of properties such as piezoelectric properties and dielectric properties which are improved by controlling the orientation of crystals. For example, tetragonal PZT is known to exhibit excellent piezoelectric properties or ferroelectric properties by achieving a c-axis orientation parallel to the polarization axis.

Furthermore, for example, Patent Documents 1 to 4 below are known as prior art which relates to an orientational ceramic sintered body.

Patent Document 1 proposes a method for producing an orientational ceramic sintered body in such a way that which a non-ferromagnetic powder that has a non-isometric crystalline structure is dispersed in a solvent, and the resulting slurry is subjected to forming by solidification in a magnetic field, and then subjected to sintering.

In Patent Document 1, for example, a slurry is prepared by dispersing an anisotropic substance such as alumina in an aqueous solution with an appropriate amount of polyelectrolyte added thereto, subjected to casting in which the slurry is cast into a porous mold and subjected to forming in a magnetic field, and then subjected to firing to obtain an orientational ceramic (sintered body).

Patent Document 2 proposes a method for producing an orientational ceramic, which includes the steps of: obtaining a ceramic slurry containing a polycrystalline ceramic powder; obtaining a ceramic compact by subjecting the ceramic slurry to forming in a magnetic field; and firing the ceramic compact, where the polycrystalline ceramic powder contains a main constituent composed of a perovskite-type compound and a predetermined amount of accessory constituent, and the accessory constituent is at least one Group III transition metal ions with a non-zero magnetic moment and rare-earth transition metal ions with a non-zero magnetic moment.

Also in Patent Document 2, a ceramic raw material powder is dispersed in an appropriate amount of water to prepare ceramic slurry, and then, as in Patent Document 1, the slurry is subjected to casting in a magnetic field, and then firing to obtain an orientational ceramic.

Further, the use of the polycrystalline ceramic powder containing the accessory constituent in a predetermined amount with respect to the main constituent of the perovskite-type compound such as barium titanate in Patent Document 2 allows an orientation in a magnetic field even in the case of using a polycrystalline ceramic powder.

Patent Document 3 proposes a method for manufacturing a piezoelectric ceramic component in which the step of preparing ceramic green sheets includes the steps of: applying a ceramic slurry containing non-magnetic ceramic particles and an ultraviolet curable binder onto base films to obtain non-oriented sheets with a predetermined thickness; feeding the non-oriented sheets into a magnetic field application system while the non-oriented sheets is supported by the base films, and applying a magnetic field in a predetermined direction to orient the non-magnetic ceramic particles in the non-oriented sheets in the direction of the magnetic field, thereby providing oriented sheets; and fixing the orientation of at least some of the non-magnetic ceramic particles in the oriented sheets.

In Patent Document 3, a bismuth layered compound or a tungsten bronze-type compound is used for the non-magnetic ceramic particles, a polyvinyl butyral resin, a cellulose resin, an acrylic resin, or the like is used for the binder resin, the ceramic slurry containing the non-magnetic ceramic particles and the binder resin is used to prepare non-oriented sheets, and the non-oriented sheets are oriented by applying a magnetic field thereto.

Furthermore, oriented sheets which have uniform particle orientation achieved by the application of the magnetic field in Patent Document 3 are prepared by making the non-oriented sheets on the base films uniform in thickness, and the oriented sheets are cured by ultraviolet irradiation, so that oriented sheets are thereby obtained which have predetermined particle orientation.

Patent Document 4 proposes a method for producing a sintered body of a perovskite-structure compound, which includes the steps of: preparing a single-crystalline powder of a perovskite-type compound; preparing, as a dispersion phase, a ceramic slurry containing the single-crystalline powder; obtaining a ceramic compact by shaping the ceramic slurry in a magnetic field; and sintering the ceramic compact.

In Patent Document 4, a single-crystalline lead titanate (hereinafter, referred to as "PT") as the perovskite-type compound is used as a ceramic raw material powder, and a ceramic slurry containing the ceramic raw material powder and a polyvinyl alcohol resin as a binder resin is shaped in a magnetic field to prepare a ceramic compact, so as to obtain an orientational ceramic (sintered body) with a high degree of orientation.

PRIOR ART PATENT DOCUMENTS

Patent Document 1: Japanese Patent Application Laid-Open No. 2002-193672 (claim 1, paragraph number [0029], etc.)
Patent Document 2: Japanese Patent Application Laid-Open No. 2008-37064 (claim 1, paragraph numbers [0013] and [0022], etc.)
Patent Document 3: Japanese Patent Application Laid-Open No. 2004-6704 (claim 1, paragraph numbers [0010], [0015], [0018], etc.)
Patent Document 4: Japanese Patent Application Laid-Open No. 2010-90021(claim 1, claim 7, paragraph numbers [0014], [0031], etc.)

SUMMARY OF THE INVENTION

Ceramic electronic components, in particular, laminate-type ceramic electronic components are typically manufactured by use of a so-called sheet method. In this sheet method, a binder resin is added to a ceramic raw material powder to prepare a ceramic slurry, the ceramic slurry is subjected to a forming process to prepare a sheet-shaped ceramic compact, if necessary, a laminated compact is prepared by stacking the ceramic compacts more than once while internal electrode layers are embedded therein, and the laminated compact is then subjected to firing to obtain a ceramic sintered body.

However, with no binder resin contained in the ceramic slurry, as in Patent Document 1, the ceramic raw material powder is dispersed in the aqueous solution to obtain a ceramic slurry which is too brittle to be handled for forming into a sheet shape, and for this reason, forming into a sheet shape is difficult even if casting is possible. More specifically, Patent Document 1 has difficulty in forming into a sheet shape, thereby resulting in a failure to obtain orientation-controlled laminate-type orientational ceramic.

While it is conceivable that a binder resin may be added to the ceramic raw material powder according to Patent Document 1, it is difficult to obtain a desired orientational ceramic in this case for the following reason.

Typically, polyvinyl alcohol resins, polyvinyl butyral resins, cellulose resins, acrylic resins, etc. are widely used as the binder resin. When these binder resins are added to the ceramic raw material powder, there is a possibility that ceramic particles may be bound to each other via the binder resins in the ceramic slurry to form aggregates of the ceramic particles. The formation of these aggregates cancels out, and thereby effects the average of the overall magnetic susceptibility for the crystals, and thus decreases the apparent anisotropy, even when the ceramic particles themselves have large magnetic anisotropy.

Moreover, in the case of substances which have intrinsically small magnetic anisotropy, such as perovskite-type compounds, it is not possible to achieve any desired orientational control even when a magnetic field is applied to try to orient the substances, and for this reason, it is difficult to obtain desired orientational ceramics as the apparent anisotropy is decreased by the formation of the aggregates.

In the case of Patent Document 2, as in Patent Document 1, the ceramic slurry is too brittle to be handled even when the ceramic slurry is to be formed into a sheet shape, because no binder resin is contained in the ceramic slurry. Since the apparent anisotropy is decreased even in the case of adding the common binder resins mentioned above, perovskite-type compounds which intrinsically have small magnetic anisotropy have difficulty in obtaining desired orientational ceramics.

While it is possible in the case of Patent Document 3 to form the ceramic slurry into a sheet shape because the binder resin is contained in the ceramic slurry, the use of a polyvinyl butyral resin, a cellulose resin, or an acrylic resin as the binder resin makes the ceramic particles likely to be aggregated with each other in the ceramic slurry to form aggregates as described above. For this reason, while it is possible to control the orientation of a substance which intrinsically has large magnetic anisotropy such as bismuth layered compounds or tungsten bronze-type compounds, the aggregation of ceramic particles with each other decreases the anisotropy of magnetic susceptibility in the case of a substance which has small magnetic anisotropy such as PZT, thereby resulting in difficulty in obtaining desired orientational ceramics.

Furthermore, the forming process in Patent Document 4, with the use of PT as the ceramic raw material powder, and with the use of a polyvinyl alcohol resin as the binder resin, is carried out in a magnetic field to obtain an orientational ceramic compact.

However, when lead zirconate titanate (hereinafter, referred to as "PZT") is used in place of PT, it is difficult for the following reason to obtain orientational ceramics subjected to desired orientational control, even if the strength of the sheet compact can be ensured.

PZT has much smaller magnetic anisotropy than PT, and moreover, the polyvinyl alcohol resin used for the binder resin makes the ceramic particles aggregated with each other in the ceramic slurry as described above. Thus, the apparent anisotropy is also decreased. In addition, the magnetic field can be applied only for a short period of time in the sheet forming, and the application of the magnetic field for the short period of time has difficulty achieving orientation. For this reason, it is difficult for substances which have small magnetic anisotropy such as PZT to obtain orientational ceramics subjected to desired orientational control.

As described above, the prior art has difficulty in preparing sheet-shaped ceramic compacts when no binder resin is added to the ceramic raw material powder because of brittleness and thus difficulty with handling. Even when the binder resin is added to the ceramic raw material powder, the case of using common polyvinyl alcohol resins, polyvinyl butyral resins, cellulose resins, acrylic resins, etc. as the binder resin leads to a decrease in anisotropy of magnetic susceptibility due to the aggregation of the ceramic particles in the case of substances which intrinsically have small magnetic anisotropy such as PZT, and it is thus difficult to obtain orientational ceramics subjected to desired orientational control.

The present invention has been achieved in view of these circumstances, and an object of the present invention is to provide a method for producing an orientational ceramic, which can achieve desired orientational control of even a substance which has small magnetic anisotropy, such as PZT, an orientational ceramic obtained by using this production method, and a ceramic electronic component such as a piezoelectric ceramic electronic component and a dielectric ceramic electronic component, which is produced with the use of this orientational ceramic.

The inventors have, in order to achieve the object, carried out earnest research to find that the use of an emulsion binder resin as the binder resin added to the ceramic raw material powder, such as an emulsion acrylic resin, substantially not containing a non-emulsion binder resin, keeps the ceramic particles from being bound to the binder resin in the ceramic slurry, thereby keeping the ceramic particles from being aggregated with each other.

The use of the emulsion binder resin substantially free of a non-emulsion binder resin makes it possible to produce an orientational ceramic subjected to desired orientational control, even in the case of a perovskite-type compound which has low anisotropy, such as PZT.

The present invention has been achieved on the basis of this finding, and a method for producing an orientational ceramic according to the present invention includes: preparing a ceramic slurry by mixing an additive containing a binder resin into a ceramic raw material powder containing, as its main constituent, a composite oxide which has a perovskite-type crystalline structure; preparing a ceramic compact by applying a magnetic field when the ceramic slurry is subjected to a forming process; and firing the ceramic compact, thereby preparing an orientational ceramic, where the binder resin is an emulsion binder resin substantially not containing a non-emulsion binder resin.

This method keeps the ceramic particles and the binder resin from being bound to each other in the ceramic slurry, thus keeping the ceramic particles from being aggregated with each other in the ceramic slurry. The method therefore makes it possible to obtain an orientational ceramic capable of being subjected to the desired orientational control, without decreasing the apparent anisotropy due to the formation of aggregates, even in the case of a perovskite-type compound which has small magnetic anisotropy, such as PZT.

It has been also found that when the ceramic slurry is to be subjected to a forming process, the ceramic particles in an oriented state are bound to each other via the binder resin when applying a magnetic field to, and then drying the ceramic slurry, or by drying the ceramic slurry while applying a magnetic field thereto.

More specifically, when producing an orientational ceramic according to the present invention, it is also preferable to prepare the ceramic compact by applying the magnetic field to, and then drying the slurry, or prepare the ceramic compact by drying the slurry while applying the magnetic field thereto.

Thus, a ceramic compact can be easily obtained which has the ceramic particles themselves in an oriented state, and bound to each other via the binder resin, and has the strength required for processing.

In addition, the emulsion binder resin is preferably an emulsion acrylic resin in the method for producing an orientational ceramic according to the present invention.

Due to the fact that the emulsion acrylic resin is particularly unlikely to adsorb onto ceramic particles among emulsion binder resins, an orientational ceramic subjected to desired orientational control can be easily obtained by using the emulsion acrylic resin as the binder resin.

Furthermore, the composite oxide is preferably a PZT based compound in the method for producing an orientational ceramic according to the present invention.

Thus, even when a PZT based compound which has small magnetic anisotropy is used for the ceramic raw material powder, an orientational ceramic subjected to desired orientational control can be obtained.

In addition, the ceramic compact is preferably prepared in the method for producing an orientational ceramic according to the present invention, by applying the ceramic slurry onto a base material, and applying a magnetic field to the ceramic slurry to be subjected to a forming process.

Thus, a sheet-shaped ceramic compact can be obtained which has been subjected to desired orientational control preferred for a laminate-type ceramic electronic component.

Furthermore, the magnitude of the applied magnetic field is preferably 3 T or more in the method for producing an orientational ceramic according to the present invention.

This magnitude makes it possible to achieve desired orientation in a relatively short period of time, even in the case of PZT or the like which has small magnetic anisotropy.

An orientational ceramic according to the present invention is produced characteristically by using the production method according to any of the aspects described above.

In addition, a ceramic electronic component according to the present invention includes a ceramic sintered body which has a ceramic layer and an internal electrode layer stacked one on top of the other and subjected to sintering, where the ceramic layer(s) are formed from the orientational ceramic.

ADVANTAGEOUS EFFECT OF THE INVENTION

The method for producing an orientational ceramic according to the present invention includes: preparing a ceramic slurry by mixing an additive containing a binder resin into a ceramic raw material powder containing, as its main constituent, a composite oxide which has a perovskite-type crystalline structure; preparing a ceramic compact by applying a magnetic field when the ceramic slurry is subjected to a forming process; and firing the ceramic compact, thereby preparing an orientational ceramic, where the binder resin is an emulsion binder resin substantially free of (i.e., not containing) a non-emulsion binder resin. Thus, the ceramic particles and the binder resin are kept from being bound to each other in the ceramic slurry, thereby keeping the ceramic particles from being aggregated with each other. The method makes it possible to obtain an orientational ceramic capable of being subjected to desired orientational control, without decreasing the apparent anisotropy due to the formation of aggregates, even in the case of a perovskite-type compound which has small magnetic anisotropy, such as PZT.

The orientational ceramic according to the present invention, which is produced by using the production method described above, can thus achieve an orientational ceramic subjected to desired orientational control even in the case of a perovskite-type compound which has small magnetic anisotropy, such as PZT.

The ceramic electronic component according to the present invention includes a ceramic sintered body which has a ceramic layer and an internal electrode layer stacked one on top of the other and subjected to sintering, where the ceramic layer(s) are formed from the orientational ceramic, and can thus achieve various types of ceramic electronic components such as piezoelectric ceramic electronic components and dielectric ceramic electronic components which have favorable electrical properties.

DETAILED DESCRIPTION OF THE INVENTION

Figure 1:
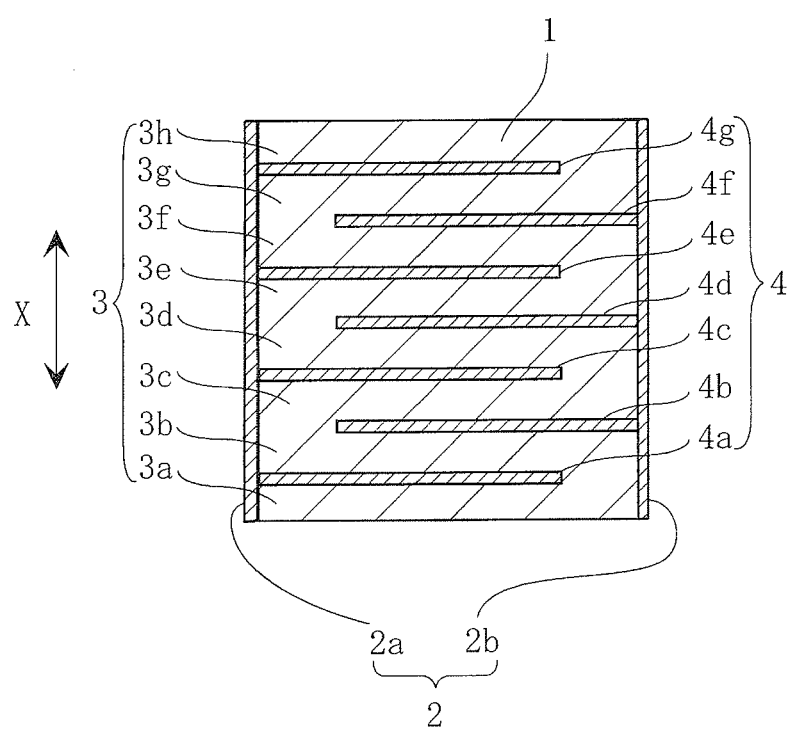
FIG. 1 is a cross-sectional view illustrating an embodiment of a piezoelectric actuator as a ceramic electronic component according to the present invention.

Next, an embodiment of the present invention will be described in detail.

The orientational ceramic according to the present invention is prepared by mixing an additive containing a binder resin with a ceramic raw material powder containing, as its main constituent, a composite oxide which has a perovskite-type crystalline structure to prepare a ceramic slurry; preparing a ceramic compact by applying a magnetic field when the ceramic slurry is subjected to a forming process; and firing the ceramic compact.

The emulsion binder resin substantially not containing a non-emulsion binder resin can thereby achieve an orientational ceramic subjected to desired orientational control, even in the case of a perovskite-type compound which has small magnetic anisotropy, such as PT and PZT.

In the case of preparing a ceramic electronic component by a sheet method, a ceramic raw material powder is made into slurry, and subjected to a forming process to prepare a ceramic compact, and if necessary, the ceramic compact is stacked more than once while internal electrode layers are embedded therein, and the compact is then subjected to firing to obtain a ceramic sintered body.

Unless the binder resin is added to the ceramic particles at the stage of preparing the ceramic slurry, the ceramic slurry will be brittle and difficult to handle in the case of forming into a sheet shape. For this reason, there is a need to add the binder resin to the ceramic particles for forming the slurry into a sheet shape.

Typically, non-emulsion binder resins such as polyvinyl alcohol resins, polyvinyl butyral resins, cellulose resins, and acrylic resins are used as the binder resin. However, the ceramic particles are aggregated with each other to form aggregates due to the fact that these non-emulsion binder resins adsorb onto the surfaces of the ceramic particles or bind the number of ceramic particles to each other in the ceramic slurry. Further, the magnetic anisotropy is cancelled because the crystal orientations for each ceramic particle are not unidirectionally aligned in the aggregates of the ceramic particles, and their presence in the entire universe of aggregates present causes the apparent anisotropy to be decreased. For this reason, perovskite-type compounds such as PZ and PZT, which have intrinsically small magnetic anisotropy, will fail to achieve the magnetic anisotropy required for the orientation, and make it difficult to obtain orientational ceramics subjected to desired orientational control, even when a magnetic field is applied.

In the present embodiment, the emulsion binder resin substantially not containing a non-emulsion binder resin is used as the binder resin, so that an orientational ceramic subjected to desired orientational control is thereby achieved even in the case of a perovskite-type compound which has small magnetic anisotropy.

More specifically, the emulsion binder resin which is not bound to the ceramic particles in the ceramic slurry can thus suppress the aggregation of the ceramic particles with each other. Due to the thus suppressed aggregation of the ceramic particles with each other, the magnetic anisotropy of the ceramic particles themselves can be utilized, thereby allowing for desired orientational control with the application of a magnetic field.

While this emulsion binder resin is not particularly limited as long as the resin is unlikely to adsorb onto the ceramic particles, and forms no aggregations in the ceramic slurry, emulsion acrylic resins can be preferably used which are particularly unlikely to adsorb onto the ceramic particles.

It is to be noted that while polyvinyl acetate resins are emulsion binder resins, an amount of a polyvinyl alcohol resin (a non-emulsion binder resin) may be added thereto or subjected to emulsion polymerization therein for the purposes of improving the viscosity and preventing separation by sedimentation as long as the amount does not unduly cause the ceramic particles to aggregate and make the magnetic susceptibility unacceptable. The polyvinyl acetate resins substantially containing a non-emulsion binder resin are unfavorably likely to form aggregates as described above.

In the present embodiment, when the ceramic slurry is to be subjected to a forming process, the ceramic particles in an oriented state are bound to each other via the binder resin by applying a magnetic field to, and then drying the ceramic slurry, or by drying the ceramic slurry while applying a magnetic field thereto. Thus, ceramic compacts can be obtained which have the strength required for processing, thereby making it possible to obtain orientational ceramics subjected to desired orientational control without damaging the workability, even in the case of substances which have small magnetic anisotropy, such as PT and PZT.

Next, a method for producing the orientational ceramic will be described in detail.

Ceramic raw materials such as $Pb_3O_4$, $TiO_2$, $ZrO_2$, NiO, and $Nb_2O_5$ are prepared, and weighed in predetermined amounts. Then, these weighed materials are put along with a liquid such as pure water in a ball mill containing therein a grinding medium such as PSZ (partially stabilized zirconia) balls for mixing and grinding the materials, subjected to drying, and then to calcination at a temperature of 1000° C. to 1200° C., and subsequently subjected to dry grinding to obtain a calcined powder.

The calcined powder, an emulsion binder resin substantially free of non-emulsion binder resin, such as an emulsion acrylic resin, an additive such as a dispersant, and pure water are again put along with a grinding medium in a ball mill, and subjected to sufficient mixing and grinding to obtain ceramic slurry.

This ceramic slurry is applied onto a carrier film such as polyethylene terephthalate (PET) film, and in a forming process, subjected to an applied predetermined magnetic field, and then dried, or dried while applying a predetermined magnetic field, thereby preparing a ceramic compact.

The magnitude of the magnetic field applied is not to be considered particularly limited herein, and preferably 3 T or more. More specifically, if the magnitude of the magnetic field applied is less than 3 T, it will be difficult to achieve sufficient torque to orient ceramic particles in the case of a perovskite-type compound which has small magnetic anisotropy, and there is the possibility of failing to achieve a sufficient degree of orientation or requiring a long period of time for orienting the ceramic particles. It is to be noted that the upper limit of the magnitude of the magnetic field is preferably 10 T or less in terms of productivity, etc.

Then, this ceramic compact is subjected to firing, thereby succeeding in obtaining an orientational ceramic subjected to desired orientational control.

In the present embodiment of preparing a ceramic slurry by mixing an additive containing a binder resin into a ceramic raw material powder containing, as its main constituent, a perovskite-type compound in a wet manner; preparing a ceramic compact by applying a magnetic field when the ceramic slurry is subjected to a forming process; and firing the ceramic compact, thereby preparing an orientational ceramic, the binder resin is formed from an emulsion binder resin substantially not containing a non-emulsion binder resin, such as an emulsion acrylic resin. Thus, the ceramic particles and the binder resin are kept from being bound to each other in the ceramic slurry, thereby keeping the ceramic particles from being aggregated with each other. Thus, the method makes it possible to obtain an orientational ceramic capable of being subjected to desired orientational control, without decreasing apparent anisotropy due to the formation of aggregates, even in the case of a perovskite-type compound which has small magnetic anisotropy, such as PZT.

Moreover, the ceramic particles themselves in an oriented state are bound to each other via the binder resin by applying a magnetic field to, and then drying the ceramic slurry, or by drying the ceramic slurry while applying a magnetic field thereto. Thus, a ceramic compact can be obtained which has the strength required for processing.

FIG. 1 is a cross-sectional view illustrating an embodiment of a laminated piezoelectric actuator as a ceramic electronic component according to the present invention, where the laminated piezoelectric actuator includes a ceramic sintered body 1 containing, as its main constituent, a ferroelectric material such as PZT, and external electrodes 2 (2a, 2b) of a conductive material such as Ag, which are formed on both ends of the ceramic sintered body 1.

The ceramic sintered body 1 has piezoelectric ceramic layers 3 (3a to 3h) and internal electrode layers 4 (4a to 4g) stacked alternately, where the piezoelectric ceramic layers 3 (3a to 3h) are composed of the orientational ceramic according to the present invention, and the internal electrode layers 4 (4a to 4g) are formed from a conductive material containing Ag, Pd, or the like as its main constituent.

In the laminated piezoelectric actuator, the internal electrode layers 4a, 4c, 4e, and 4g have ends electrically connected to the external electrode 2a, whereas the internal electrode layers 4b, 4d, and 4f have ends electrically connected to the other external electrode 2b. When a voltage is applied between the external electrodes 2a and 2b, the piezoelectric actuator is displaced by a longitudinal piezoelectric effect in the stacking direction indicated by an arrow X.

Next, a method for manufacturing the laminated piezoelectric actuator will be described in detail.

First, sheet-shaped ceramic compacts containing, as their main constituent, a ferroelectric material such as PZT are prepared by the method described above.

Then, a conductive paste for internal electrodes, which contains Ag, Pd, or the like as its main constituent, is used to screen print onto the ceramic compacts, thereby forming conductive layers in a predetermined shape.

Next, these ceramic compacts with the conductive layers formed thereon are stacked, followed by stacking a ceramic compact with no conductive layer formed on the uppermost layer, and a pressure is applied to these compacts for pressure bonding. The pressure bonding produces a laminated compact which has the conductive layers and ceramic compacts stacked alternately.

The laminated compact is cut into a predetermined size and housed in an aluminum sagger, subjected to a binder removal treatment at a predetermined temperature (for example, 250° C. to 500° C.), and then subjected to firing at a predetermined temperature (for example, 1000° C. to 1200° C.) under the atmosphere or under an oxygen atmosphere, thereby forming the ceramic sintered body 1 in which the ceramic layers 3a to 3h composed of the orientational ceramic and the internal electrode layers 4a to 4g are stacked alternately.

Then, a conductive paste for external electrodes, which is composed of Ag or the like, is applied onto both ends of the ceramic sintered body 1, and subjected to a baking treatment at a predetermined temperature (for example, 750° C. to 850° C.), thereby forming the external electrodes 2a and 2b. Thereafter, a predetermined polarization treatment is carried out, thereby manufacturing the laminated piezoelectric actuator.

It is to be noted that while the external electrodes 2a and 2b are formed by the baking treatment in the present embodiment, the external electrodes 2a and 2b only have to have favorable adhesion, and thus may be formed by a thin-film formation method such as, for example, a sputtering method or a vacuum deposition method.

As described above, the laminated piezoelectric actuator has the ceramic layers 3a to 3h formed from the orientational ceramic subjected to desired orientational control, and can thus achieve a laminated piezoelectric actuator which has favorable piezoelectric properties such as a piezoelectric constant.

It is to be noted that the present invention is not to be considered limited to the embodiment described above. While the laminated piezoelectric actuator as a ceramic electronic component has been described as an example in the embodiment, it is obvious that the present invention is similarly applicable to other ceramic electronic components, for example, various types of piezoelectric ceramic electronic components and dielectric ceramic electronic components such as laminated ceramic capacitors.

Next, an example of the present invention will be specifically described.

EXAMPLE

Preparation of Sample Numbers 1 to 4

$Pb_3O_4$, $TiO_2$, $ZrO_2$, NiO, and $Nb_2O_5$ were prepared as ceramic raw materials. Then, these ceramic raw materials were weighed in predetermined amounts, and the weighed materials were put in a ball mill along with pure water as a solvent and PSZ balls as a grinding medium, and sufficiently mixed and ground in the ball mill.

The mixture was then dried, and subjected to calcination at a temperature of 1100° C., and thereafter to dry grinding, thereby providing a calcined powder represented by the composition formula $Pb\{Ti_{0.40}Zr_{0.35}(Ni_{1/3}Nb_{2/3})_{0.25}\}O_3$.

Next, prepared were an emulsion acrylic resin as the emulsion binder resin substantially not containing a non-emulsion binder resin, a polyvinyl acetate resin as an emulsion binder resin containing a non-emulsion binder resin, a polyvinyl alcohol resin as a non-emulsion binder resin, and an aqueous acrylic resin.

Then, 12 parts by weight of the binder resin, 0.8 parts by weight of a dispersant, and 40 parts by weight of pure water with respect to 100 parts by weight of the calcined powder were mixed and ground in a wet manner for 24 hours in a ball mill in the presence of PSZ balls, thereby providing ceramic slurries according to sample numbers 1 to 4.

Next, these ceramic slurries were applied onto PET films, and during forming them into a sheet shape, subjected to an applied magnetic field of 9.0 T, and then dried, thereby preparing ceramic compacts.

Then, a paste for internal electrodes, containing Ag as its main constituent, was applied onto the ceramic compacts to form conductive layers in a predetermined pattern. Several ceramic compacts with the conductive layers formed thereon were stacked, a ceramic compact with no conductive layer formed was stacked on the uppermost layer, and pressure bonding was then carried out to obtain a laminated compact.

The laminated compact was subjected to degreasing at a temperature of 350° C., and then to firing at 1100° C. for 3 hours, thereby providing ceramic sintered bodies according to sample numbers 1 to 4.

Sample Number 5

A ceramic sintered body according to sample number 5 was prepared in accordance with the same method and procedure as in the case of sample numbers 1 to 4, except that a ceramic compact subjected to no magnetic field applied was used to prepare the ceramic sintered body.

Evaluation of Samples

For sample numbers 1 to 5, an X-ray diffraction measurement system (characteristic X-ray: CuKα ray) was used to measure an X-ray diffraction spectrum on a plane (T plane) perpendicular to the direction of applying a magnetic field in the range of diffraction angle 2θ between 15° to 65°.

In addition, the Lotgering method was used to figure out the degree of orientation F for sample numbers 1 to 5.

More specifically, the degree of orientation F is calculated according to the Lotgering method by the following formula (1).

$$F = \frac{\frac{\Sigma I(HKL)}{\Sigma I(hkl)} - \frac{\Sigma I o(HKL)}{\Sigma I o(hkl)}}{1 - \frac{\Sigma I o(HKL)}{\Sigma I(hkl)}} \tag{1}$$

In the formula, ΣI(HKL) represents the sum of X-ray peak intensities on specific crystal planes (HKL) of a measurement sample, and ΣI(hkl) represents the sum of X-ray peak intensities on all crystal planes (hkl) of the measurement sample. In addition, ΣIo(HKL) represents the sum of X-ray peak intensities on specific crystal planes (HKL) of a reference sample, and ΣIo(hkl) represents the sum of X-ray peak intensities on all crystal planes (hkl) of the reference sample.

The intensities on each of crystal planes (001), (100), (101), (110), (111), (002), (200), (102), (201), (210), (112), and (211) were used as the X-ray peak intensities on all crystal planes (hkl) in the present example.

In addition, the intensities on each crystal plane of (001), (100), (002), and (200) were used as the X-ray peak intensities on specific crystal planes (HKL). Non-orientation sample number 5 was used as the reference sample.

It is to be noted that in the case of the PZT based compound used in the present example, which is even oriented along the a-axis (H00) or c-axis (00L) among crystal axes at the stage of the ceramic compact, the crystal system is changed from the tetragonal system to the cubic system because of the temperature increase by firing, thereby eliminating the difference between the a-axis (H00) and the c-axis (00L). The temperature decrease to room temperature in this condition returns the crystal axes to the a-axis (H00) and the c-axis (00L) in a random manner. For this reason, the degree of orientation F was calculated with all axes assumed to be oriented along the a-axis (H00), without distinguishing between the a-axis (H00) and the c-axis (00L) in the present example.

Figure 2:
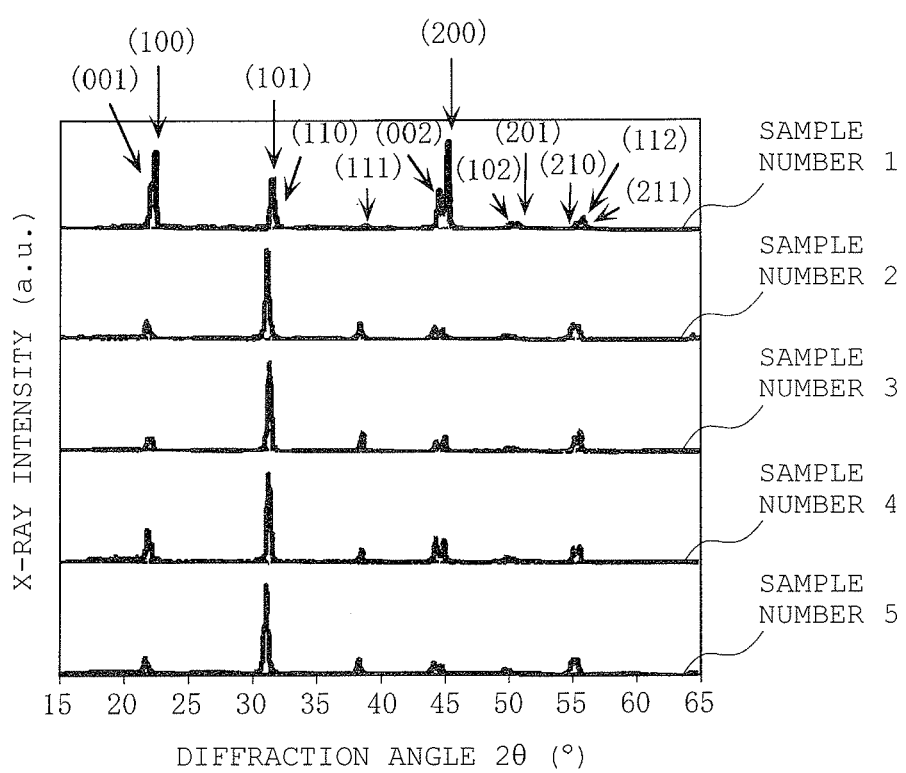
FIG. 2 is a diagram showing X-ray diffraction spectra according to an example.

FIG. 2 shows the measurement results of respective X-ray diffraction spectra for sample numbers 1 to 5. In the figure, the horizontal axis indicates a diffraction axis 2θ (°), whereas the vertical axis indicates an X-ray intensity (a.u.).

In addition, Table 1 shows the type of the binder, the applied magnetic field, and the degree of orientation F for sample numbers 1 to 5.

TABLE 1

| Sample No. | Binder Resin | Applied Magnetic Field (T) | Degree of Orientation F (—) |
|---|---|---|---|
| 1 | Emulsion Acrylic Resin | 9.0 | 0.70 |
| 2* | Polyvinyl Alcohol Resin | 9.0 | 0.00 |
| 3* | Polyvinyl Acetate Resin | 9.0 | 0.04 |
| 4* | Aqueous Acrylic Resin | 9.0 | 0.24 |
| 5* | Emulsion Acrylic Resin | 0.0 | 0.00 |

*outside the scope of the present invention

As is clear from FIG. 2 and Table 1, it has been determined that sample numbers 2 to 4 are inferior in orientation with the degree of orientation F equal to or less than 0.24 even in the case of the magnetic field of 9.0 T applied, because they contain a non-emulsion binder resin. In addition, it has been confirmed that peaks of high X-ray intensities are observed on the (101) plane, while there are extremely low X-ray intensities on the (100) plane and the (200) plane for the X-ray diffraction spectra.

It has been determined that sample number 5 is not oriented, having a degree of orientation F: 0.0, because of no magnetic field being applied while the use of the emulsion acrylic resin. In the X-ray diffraction spectrum, it has been confirmed that a peak of a high X-ray intensity is observed on the (101) plane, while there are low X-ray intensities on the (100) plane and the (200) plane.

In contrast, it has been determined that sample number 1 has favorable orientation with the degree of orientation: 0.70 and peaks of high X-ray intensities observed on the (100) plane and the (200) plane, because of using the emulsion acrylic resin and having a magnetic field of 9.0 T applied.

INDUSTRIAL APPLICABILITY

Even in the case of substances which have small magnetic anisotropy, such as PZT, orientational ceramics can be obtained which can be subjected to desired orientational control without damaging workability, and it is possible to obtain various types of ceramic electronic components which have favorable electrical properties.

DESCRIPTION OF REFERENCE SYMBOLS 1 ceramic sintered body
3a to 3g ceramic layer
4a to 4g internal electrode layer

What is claimed is:

1. A method for producing an orientational ceramic comprising: providing a ceramic slurry comprising an additive containing an emulsion binder resin and a ceramic raw material powder containing, as its main constituent, a composite oxide which has a perovskite-type crystalline structure, wherein the slurry is substantially free of non-emulsion binder resin; forming the ceramic slurry into a ceramic compact while applying a magnetic field; and firing the ceramic compact, thereby preparing the orientational ceramic.

2. The method for producing an orientational ceramic according to claim 1, wherein the ceramic compact is dried after applying the magnetic field.

3. The method for producing an orientational ceramic according to claim 1, wherein the ceramic compact is dried while applying the magnetic field.

4. The method for producing an orientational ceramic according to claim 3, wherein the emulsion binder resin is an emulsion acrylic resin.

5. The method for producing an orientational ceramic according to claim 4, wherein the composite oxide is a lead zirconate titanate and the applied magnetic field has a magnitude of 3 T or more.

6. The method for producing an orientational ceramic according to claim 2, wherein the emulsion binder resin is an emulsion acrylic resin.

7. The method for producing an orientational ceramic according to claim 6, wherein the composite oxide is a lead zirconate titanate and the applied magnetic field has a magnitude of 3 T or more.

8. The method for producing an orientational ceramic according to claim 1, wherein the emulsion binder resin is an emulsion acrylic resin.

9. The method for producing an orientational ceramic according to claim 8, wherein the composite oxide is a lead zirconate titanate and the applied magnetic field has a magnitude of 3 T or more.

10. The method for producing an orientational ceramic according to claim 1, wherein the composite oxide is a lead zirconate titanate.

11. The method for producing an orientational ceramic according to claim 1, wherein the ceramic compact is formed by applying the ceramic slurry onto a base material.

12. The method for producing an orientational ceramic according to claim 1, wherein the applied magnetic field has a magnitude of 3 T or more.

13. An orientational ceramic produced by the production method according to claim 1.

14. A ceramic electronic component comprising a ceramic sintered body comprising a ceramic layer of the orientational ceramic according to claim 13 and an electrode layer stacked one on top of the other.

15. An orientational ceramic comprising a fired ceramic compact comprising a magnetic field orientated combination of an emulsion binder resin and a composite oxide which has a perovskite-type crystalline structure, and the combination being substantially free of non-emulsion binder resin.

16. The orientational ceramic according to claim 13, wherein the composite oxide is a lead zirconate titanate.

17. The orientational ceramic according to claim 16, wherein the emulsion binder resin is an emulsion acrylic resin.

18. A ceramic electronic component comprising a ceramic sintered body comprising a ceramic layer of the orientational ceramic according to claim 17 and an electrode layer stacked one on top of the other.

19. A ceramic electronic component comprising a ceramic sintered body comprising a ceramic layer of the orientational ceramic according to claim 16 and an electrode layer stacked one on top of the other.

20. A ceramic electronic component comprising a ceramic sintered body comprising a ceramic layer of the orientational ceramic according to claim 15 and an electrode layer stacked one on top of the other.

* * * * *